US006220867B1

(12) United States Patent
Tsai

(10) Patent No.: US 6,220,867 B1
(45) Date of Patent: Apr. 24, 2001

(54) JOINING-STRUCTURE FOR A HIGH-DENSITY CONNECTOR AND INTERFACE MODULE

(75) Inventor: Tien-Ching Tsai, Taipei Hsiean (TW)

(73) Assignee: Win Win Precision Industrial Co., Ltd., Taipei Hsien (TW)

( * ) Notice: Subject to any disclaimer, the term of this patent is extended or adjusted under 35 U.S.C. 154(b) by 0 days.

(21) Appl. No.: 09/195,174

(22) Filed: Nov. 17, 1998

(51) Int. Cl.[7] .............................. H01R 12/00; H05K 1/00

(52) U.S. Cl. .............................................. 439/60; 439/327

(58) Field of Search ............................. 439/60, 637, 325, 439/327, 328, 487; 411/573, 564

(56) References Cited

U.S. PATENT DOCUMENTS

| | | | | |
|---|---|---|---|---|
| 3,582,865 | * | 6/1971 | Franck et al. | 339/17 |
| 3,991,346 | * | 11/1976 | Reid et al. | 317/100 |
| 4,533,978 | * | 8/1985 | Walter | 361/419 |
| 5,449,297 | * | 9/1995 | Bellomo et al. | 439/630 |
| 5,478,259 | * | 12/1995 | Noschese | 439/607 |
| 5,662,485 | * | 9/1997 | Yip et al. | 439/157 |

* cited by examiner

*Primary Examiner*—Lincoln Donovan
*Assistant Examiner*—Kyung S. Lee
(74) *Attorney, Agent, or Firm*—Pro-Techtor International Services

(57) ABSTRACT

This invention relates to a join-structure of high-density connector and interface module comprising a dielectric housing unit, a plurality of terminals, an interface card, a retention mechanism, and a motherboard, wherein the join-structure includes a lateral contact and a plate contact type. In the lateral contact type, terminals in upper layer and lower layer are punched and aligned in a single material feeding band in staggered arrangement, and the terminals in the material feeding band can be folded at connection strips to stand in two rows. As to plate contact type, two-layer terminals are cross-inserted to fixing roots, which are designed in two-section manner and supported at two turning points with enhancing protruded strips. The terminals are plugged and fixed in reception grooves of the dielectric housing unit. A retention mechanism cooperating with a movable piece facilitates an easy dismounting of an interface module, wherein a fixing device is employed to fix the retention mechanism onto a motherboard, and an interface card may join a heat sink with fixing pins for a convenient assembly and a rapid disassembly.

4 Claims, 20 Drawing Sheets

JOINING-STRUCTURE FOR A HIGH-DENSITY CONNECTOR AND INTERFACE MODULE

BACKGROUND OF THE INVENTION

1. Field of the Invention

This invention relates to a join-structure of high-density connector and interface module, particularly to a join-structure of high-density connector and interface module that can save connecting material, hold connection firmly, and facilitate easy mounting and dismounting of an interface module.

2. Description of the Prior Art

A conventional join-structure of high-density connector and interface module usually has two categories in its conductive terminals, including a cutting face lateral contact type (abbrev. as type A hereinafter) and a folded plate contact type (abbrev. as type B hereinafter). U.S. Pat. Nos. 5,071,371 and 5,425,658 are examples of type A, wherein two separated pairs (4 terminal pieces) overlap each other in most of their areas, and the employed terminal material is in relatively large amount that seemed to have been overdone. In another U.S. Pat. No. 5,024,609 of type B, a component separator is used to fix and align the conductive strips that increases manpower, production cost, and complexity.

A U.S. patent application Ser. No. 08/430952 applied on Apr. 28, 1995 (ROC patent No. 312859) is a conventional join-structure of connector and interface module, wherein terminals in upper and middle layers are installed in straight lines in a reception slot, and volume of the entire body and needed terminal material are enlarged because of mounting of terminals at two lateral ends. And moreover, terminals in middle layer is prone to contact with that in lower layer when plugging in or pulling out a daughter board, so that, its function as well as usage has been compressed.

With respect to prior skill of join-structure of high-density connector and interface module, please refer to U.S. Pat. No. 5,026,292, wherein terminal of type A and B both are used in a connector that may require complicated procedures in manufacturing and assembling.

Major embodiments in U.S. Pat. No. 5,051,099 employ the same conductive strips as of type A and B in the mentioned U.S. Pat. No. 5,026,292, wherein FIG. 8 indicates another embodiment using terminals arranged in an upper as well as a lower layer respectively, and the terminals are laminated and polished aside that cannot contact with conductive strips thoroughly.

Moreover, FIG. 9 in the aforesaid patent reveals a type B embodiment, wherein the flaglike contact realm of the lower layer terminals requires a larger activity space that results in an enlarged slot at upper portion for reception a daughter board. However, owing to lack of guiding and positioning function, the daughter board cannot be plugged in the slot easily that may deform or impair the terminals to no longer coincide with golden fingers of the daughter board in geometric progression interval alignment (abbrev. as GPIA hereinafter).

Design of a usual join-structure of connector and interface module has progressed in GPIA alignment as revealed in U.S. patent application Ser. No. 08/712868 (ROC patent No. 304284), wherein terminals of type A and B have been employed and arranged in an upper layer as well as a lower layer disposed in a single reception slot, however, in case a defect is found in manufacturing process or in the upper layer of a finished product, the intact lower layer has to be dismounted before removing or replacing the erroneous upper layer. This troublesome maintenance procedure will cost considerable manpower that has to be improved for sure.

Besides, a known retention mechanism, which can be applied to hold either a card type or a cartridge type interface module, is weak in dismounting procedure. A user has to use his hands to hold and pull an interface module out from the slot bit by bit and end by end. Such an inconvenient dismounting operation is also in need of improvement conspicuously.

In view of the aforesaid imperfections, and after years of constant efforts in research, this invention is taking the opportunity to propose a preferred structure, which is to be summarized below.

SUMMARY OF THE INVENTION

The main object of this invention is to provide a join-structure of high-density connector and interface module, wherein terminals of a lateral contact type, which is designed to save material, area, and volume, will be plugged in a reception slot and fixed firmly. Another object of this invention is to provide a join-structure of high-density connector and interface module, wherein terminals of a plate face contact type designed staggering in root ends can be torn up for material saving.

One more object of this invention is to provide a join-structure of high-density connector and interface module, wherein positioning pins are either plugged to anchor or pivoted to anchor for fixing the retention mechanism onto a motherboard.

Another more object of this invention is to provide a join-structure of high-density connector and interface module, wherein fixing pins are employed to fix and latch a heat sink to the daughter board for low cost and easy assembly purposes.

A further object of this invention is to provide a join-structure of high-density connector and interface module, wherein a movable frame on the retention mechanism is foldable inwards or exchangeable to retain a card type or a cartridge type interface module for multipurpose application.

A furthermore object of this invention is to provide a join-structure of high-density connector and interface module, wherein a flexible portion and a snap fastening portion of the retention mechanism cooperating with a movable piece can release simply and rapidly the fastened interface module from the retention mechanism.

With the above-described merits, the join-structure of high-density connector and interface module comprises a dielectric housing unit, a plurality of terminals, an interface card, a heat sink, a retention mechanism and a motherboard, wherein two kinds of structure of a conductive strip are available—a cutting face lateral contact and a folded plate contact; for the former, a material feeding band is punched to form simultaneously two different independent terminal sets in zigzag alignment at opposite sides that can be torn up easily; and for the latter, the alignment is the same as in the former, while the root portion includes two sections, and a enhancing protruded strip is provided at two turning points in a terminal; and the terminals are snap-fastened to the reception slot in the dielectric housing unit.

BRIEF DESCRIPTION OF THE DRAWINGS

For a better understanding to the present invention, together with further advantages or features thereof at least one preferred embodiment will be elucidated below with reference to the annexed drawings in which.

DETAILED DESCRIPTION OF THE PREFERRED EMBODIMENT

Figure 1A:
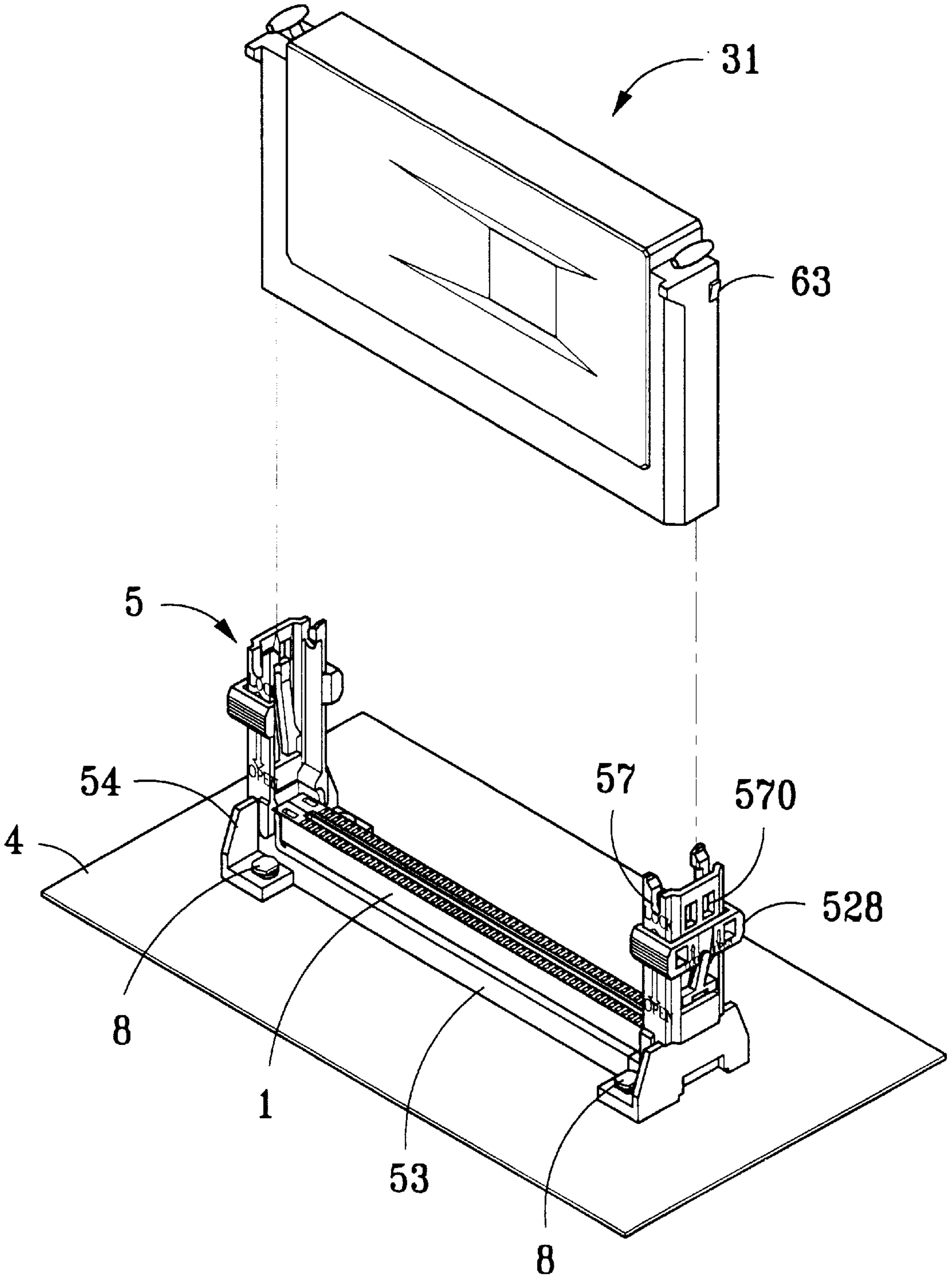
FIG. 1A is a three-dimensional exploded view showing a join-structure of a high-density connector and a cartridge type interface module of this invention.
Figure 1B:
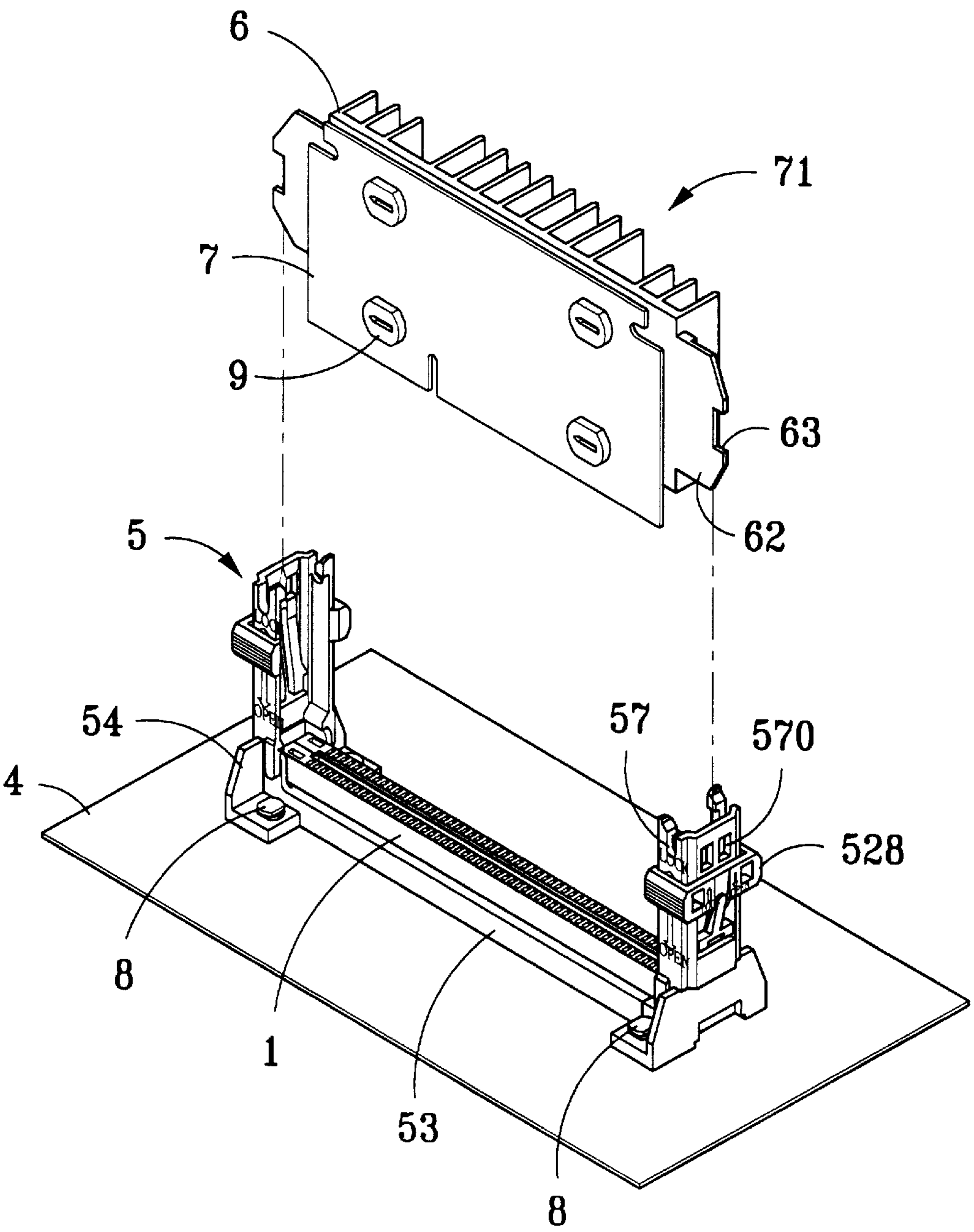
FIG. 1B is a three-dimensional exploded view showing the join-structure of a high-density connector and a card type interface module of this invention.

As shown in FIG. 1A, FIG. 1B, FIG. 2, and FIG. 4A and FIG. 4B, a join-structure of high-density connector and interface module of this invention comprises a dielectric housing unit 1, a plurality of terminals (conductive strip) 2, a card type interface module 7 or cartridge type interface module 3, a retention mechanism 5, a movable piece 582, and a motherboard 4. An insertion slot 10 is formed in a central portion of the dielectric housing unit 1, wherein a plurality of reception grooves 11 partitioned by inner walls 12 is aligned along both sides of the insertion slot 10, and a fixing recess 120 is formed near bottom of the inner walls 12, and a long protrusion strip 13 is disposed at bottom of the dielectric housing unit 1.

Figure 2:
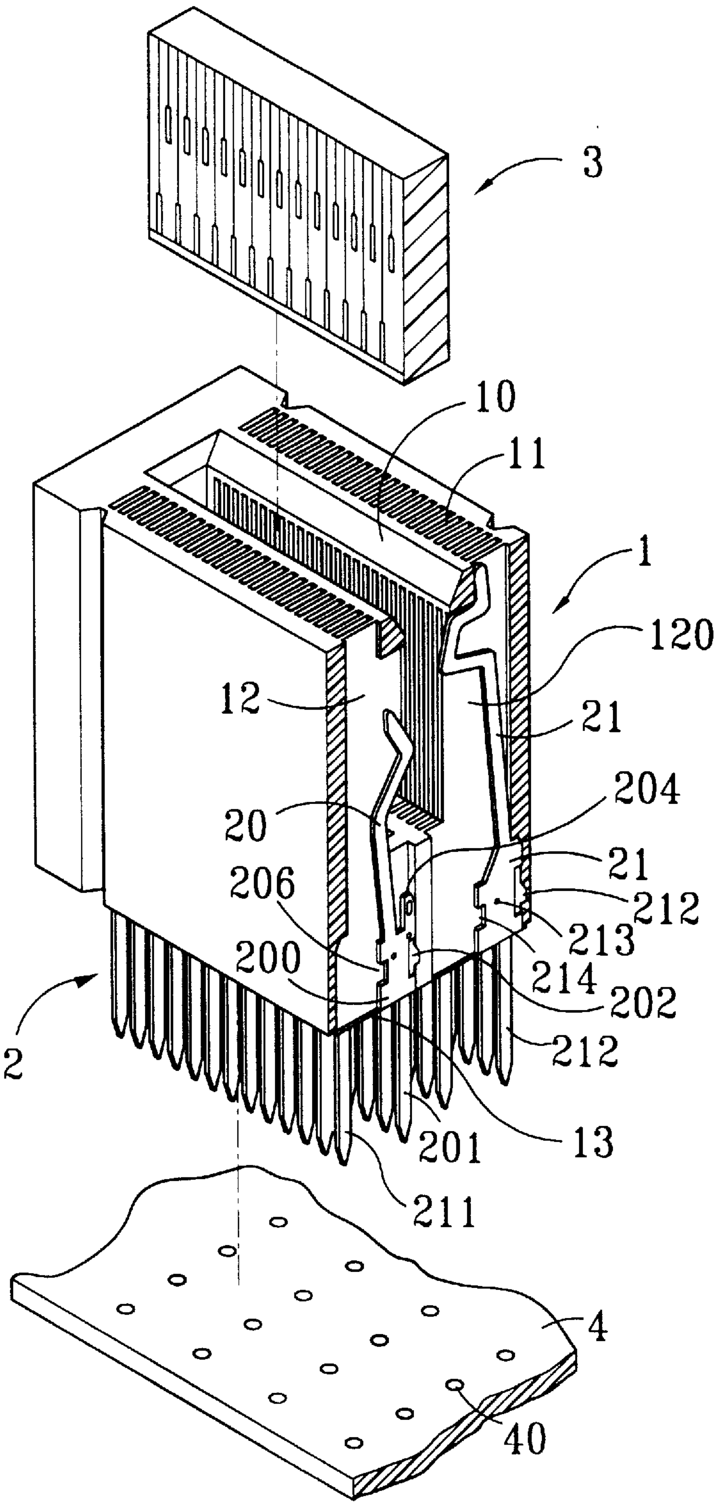
FIG. 2 is a schematic three-dimensional partial view showing the join-structure of a cutting face contact type high-density connector and an interface module of this invention.
Figure 3:
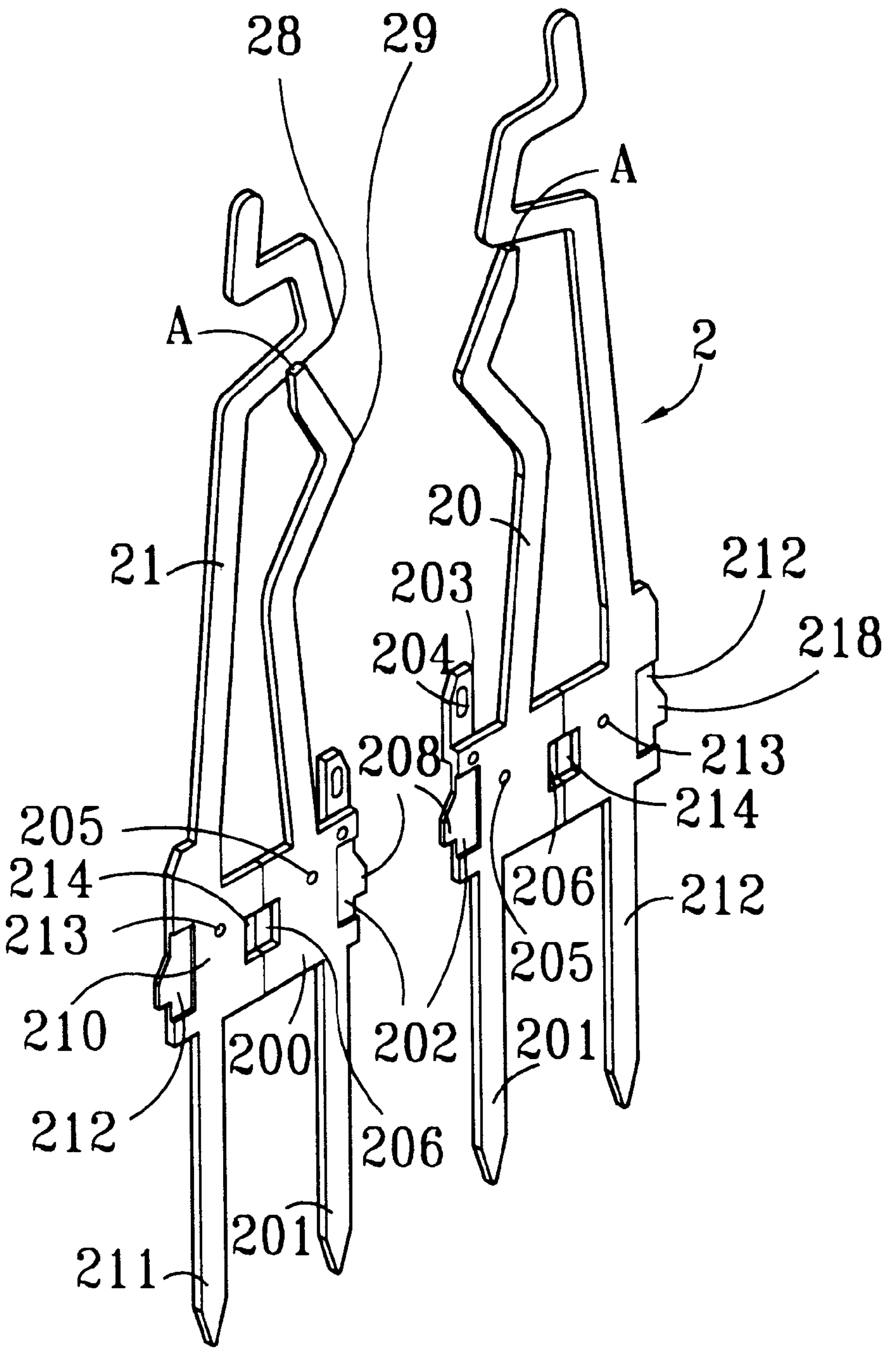
FIG. 3 is a three-dimensional cutaway view showing the join-structure of a cutting face contact type high-density connector and an interface module of this invention.
Figure 4B:
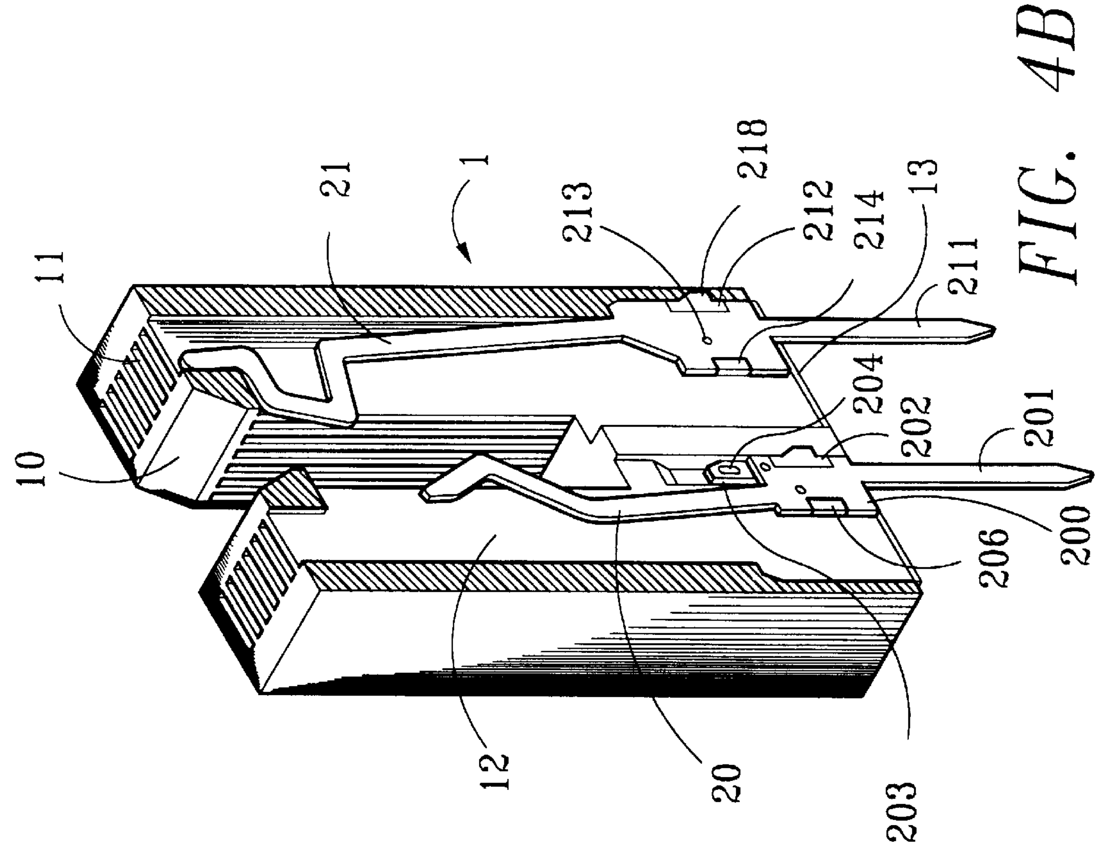
FIG. 4B indicates a partial completed section of the join-structure of a cutting face contact type high-density connector and an interface module of this invention.
Figure 4A:
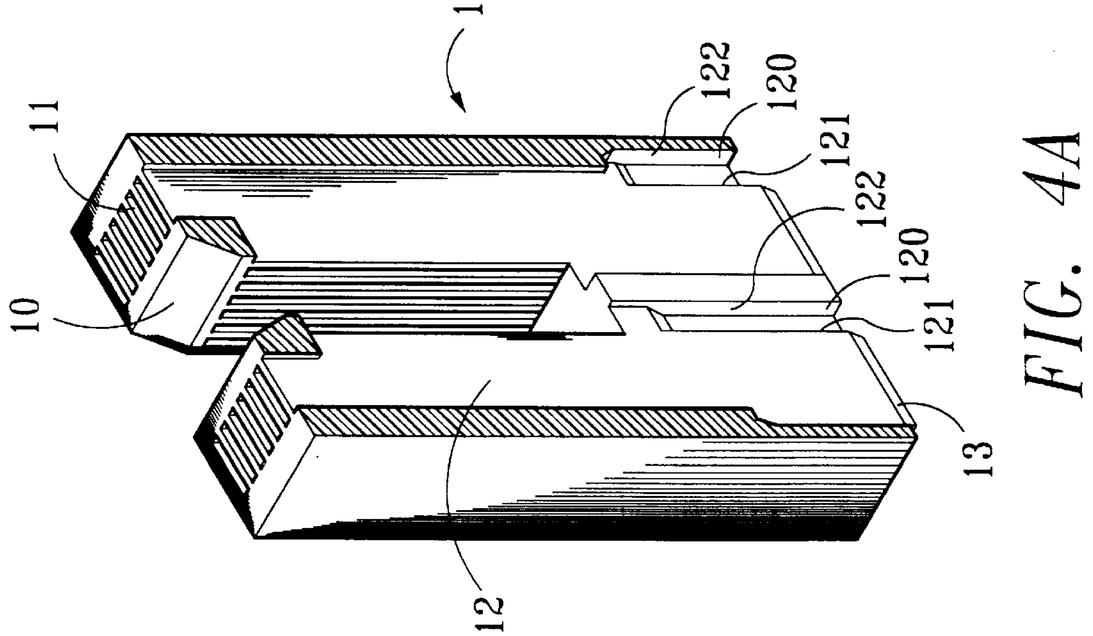
FIG. 4A is a schematic partial view showing the join-structure of a cutting face contact type high-density connector and an interface module of this invention.
Figure 5:
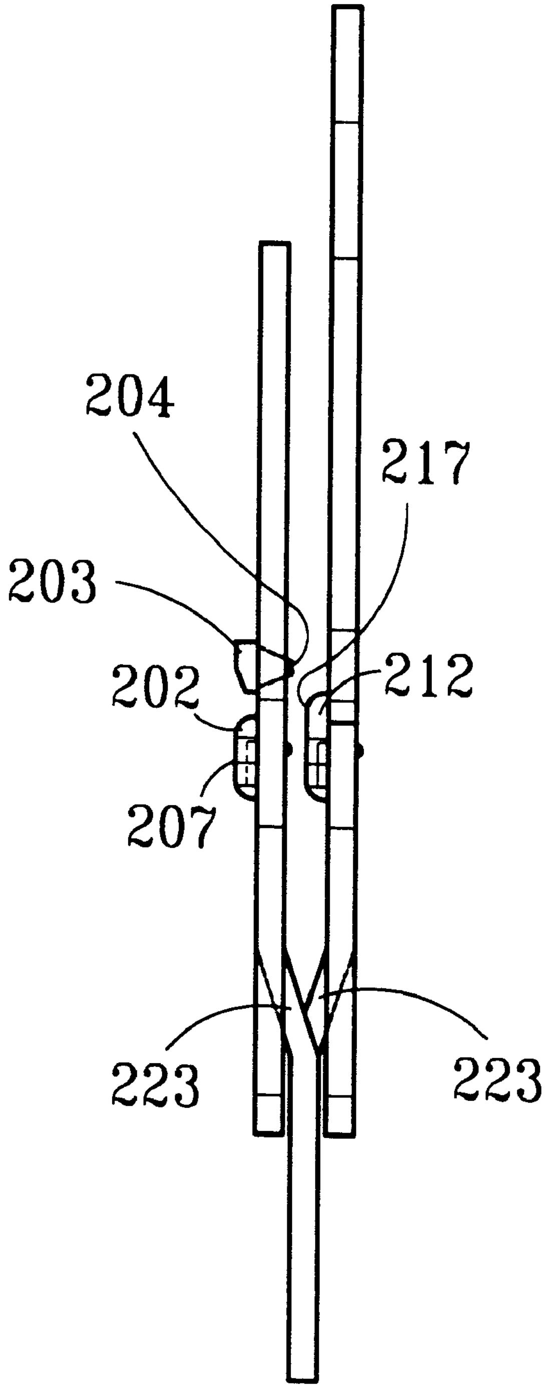
FIG. 5 is a schematic view showing a cutting face contact type terminal and a material feeding band of the join-structure of a high-density connector and an interface module of this invention.
Figure 6:
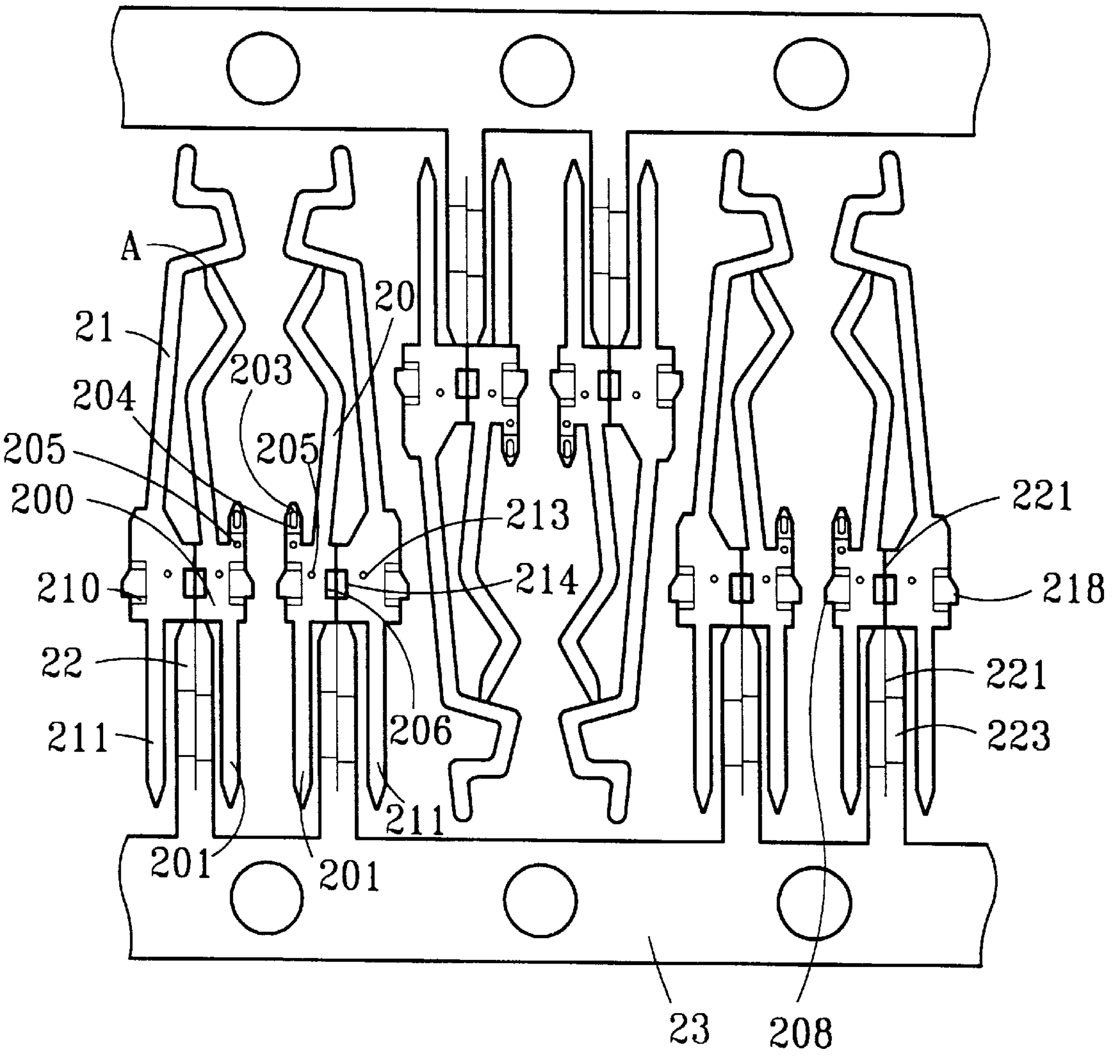
FIG. 6 is another schematic view showing alignment of cutting face contact type terminals in a material feeding band of the join-structure of a high-density connector and an interface module of this invention.
Figure 7A:
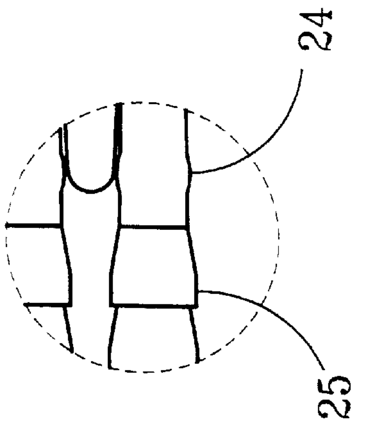
FIG. 7A is a schematic amplified view showing a fixed root in FIG. 7.
Figure 7:
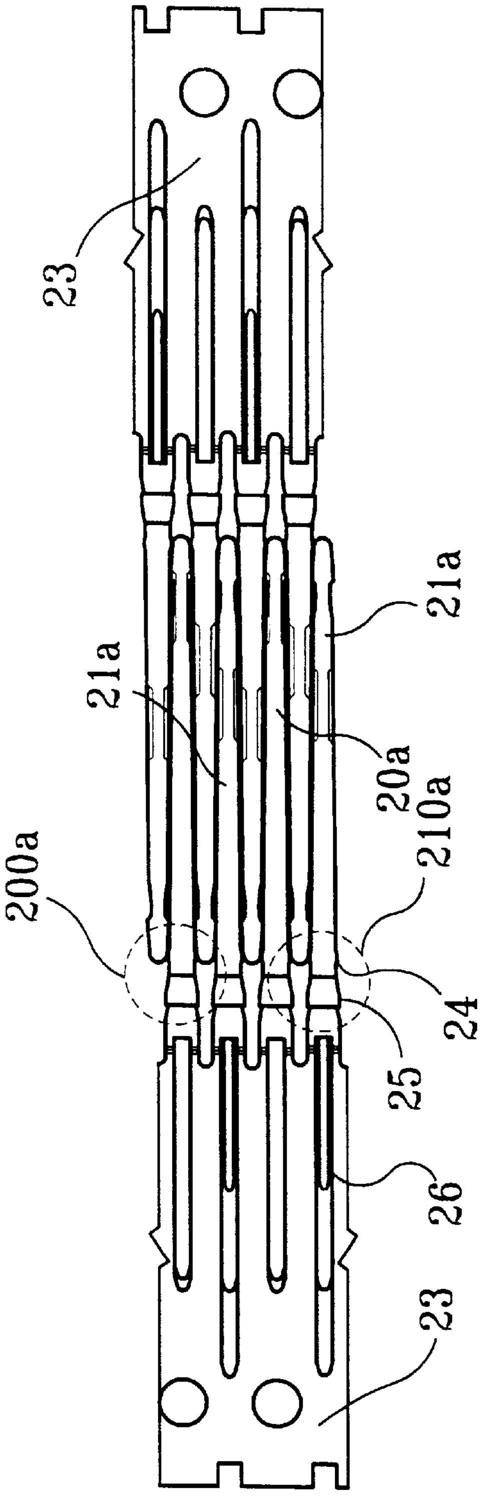
FIG. 7 is another schematic view showing alignment of folded plate contact type terminals in a material feeding band of the join-structure of a high-density connector and an interface module of this invention.
Figure 8A:
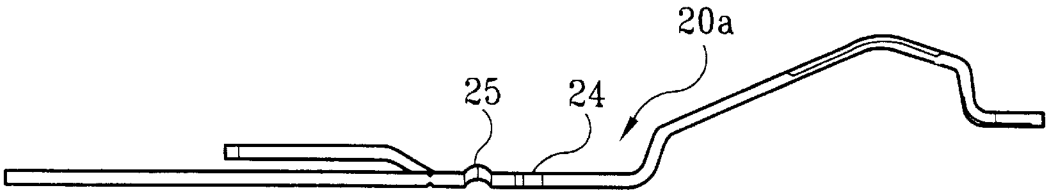
FIG. 8A is a schematic view showing a folded plate contact type terminal in upper layer and a material feeding band of the join-structure of a high-density connector and an interface module of this invention.
Figure 8B:
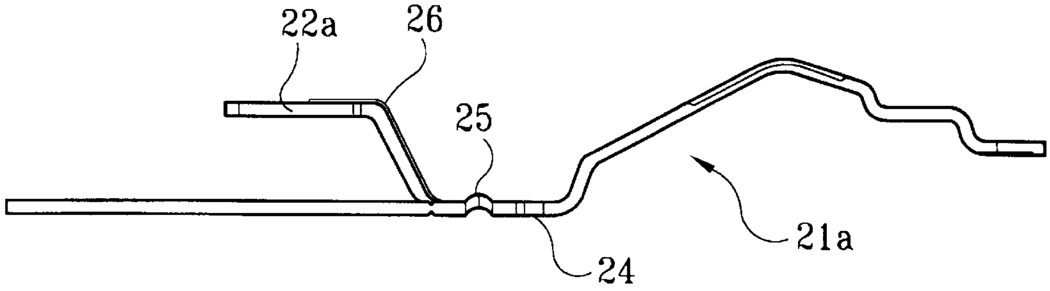
FIG. 8B is a schematic view showing a folded plate contact type terminal in lower layer and a material feeding band of the join-structure of a high-density connector and an interface module of this invention.

There are two kinds of structure of a conductive strip 2—a cutting face contact type and a folded plate contact type. As shown in FIG. 2, FIG. 3, and FIG. 4B, two pairs (4 pieces) of terminals 2 are formed in copper feeding band (one terminal at lower layer 20 and another at upper layer 21 become one pair). In each pair of terminals 20, 21, a fixing root 200, 210 is located at knee position and further extended downwards to form a soldering portion 201, 211, wherein a protrusion 205, 213 is disposed on the fixing root 200, 210 and on reverse side, another protrusion 206, 214, and a protruded fixing strip 202, 212 is formed. A protruded sticker 208, 218 is arranged at lateral side of the protruded fixing strip 202, 212, wherein the protruded fixing strip 202 of the lower layer terminal 20 is extended upwards to form a stuffing fixer 203 and a protruded dot 204 to offer enough space for join with the reception groove 11 and the fixing recess 120. Two pairs of terminals 2 are staggered and fixed in the reception groove 11 of the dielectric housing unit 1, wherein the lower layer terminals and that in the upper layer are partitioned equally placed to obtain a uniform interval alignment of terminals 20, 21; and the soldering portion 201, 211 are poking out of the dielectric housing unit 1. An interface module 3 is plugged in insertion slot 10 of the dielectric housing unit 1 in uniform alignment intervals. Further, a plurality of circular holes 40 are disposed on the motherboard 4 for reception of the soldering portion 201, 211.

As shown in FIG. 3, FIG. 4A, FIG. 4B, FIG. 5, and FIG. 6, the fixing root 200, 210 of the terminals 2 is extended downwards to meet a connection strip 22 and a material feeding band 23, wherein the upper layer terminals 21 and the lower layer terminals 20 are staggered that can be cut to detach from each other. Two terminal rows may stand independently in the material feeding band by folding the connection strips 22 in opposite directions. Point A between two contact points 28, 29 in a pair of upper and lower layer terminals 21, 20, and a decent portion in the fixing root 200, 210 and in the connection strip 22 will be cut off to detach a pair of terminals 2. Thus, every material feeding band 23 can produce terminals 2 in two rows to save material and manpower for assembling. With a specified length of material feeding band 23, a usual method produces two pieces of terminal 2 in one row, which is assembled one row at one time accordingly, while this invention can double the yield that two rows may be assembled simultaneously in the reception grooves 11 of the dielectric housing unit 1. When assembling, cut off at first two lateral sides of the protruded fixing strip 202, 212, and by favor of burr face 207, 217 in acute angle and protruded sticker 208, 218 that enables a terminal 2 to stick intimately to the fixing recess 120, and meantime to lean against the protrusion 206, 214, as well as protrusion 205, 213 on the reverse face to have the terminal 2 positioned uprightly in the reception groove 11.

As shown in FIG. 7, FIG. 7A, FIG. 8A, and FIG. 8B, terminals of upper and lower layers 20*a,* 21*a* are cross-aligned on a material feeding band 23, and it needs only one set of mold to punch and form terminals in two rows at a time for saving of material and manpower. The snaky terminals wriggling to the fixing root 200*a,* 210*a,* which consists of two sections 24, 25, can be torn apart to form individuals, wherein the first section of the fixing root 24 is slightly smaller than the second section 25, and in two turning points of the soldering portion 22*a* of the lower layer terminals 21*a,* an enhancing protruded strip 26 is provided for strengthening purpose.

Figure 9A:
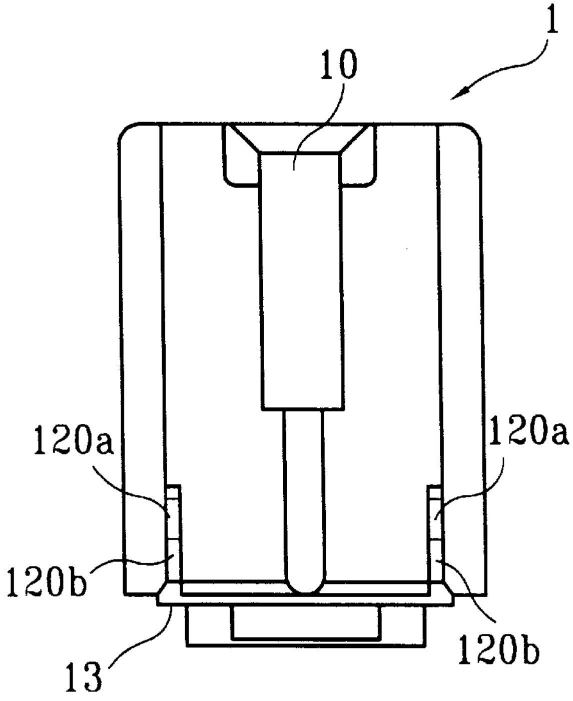
FIG. 9A is a schematic right end lateral view showing a folded plate type dielectric housing unit of the join-structure of a high-density connector and an interface module of this invention.
Figure 9B:
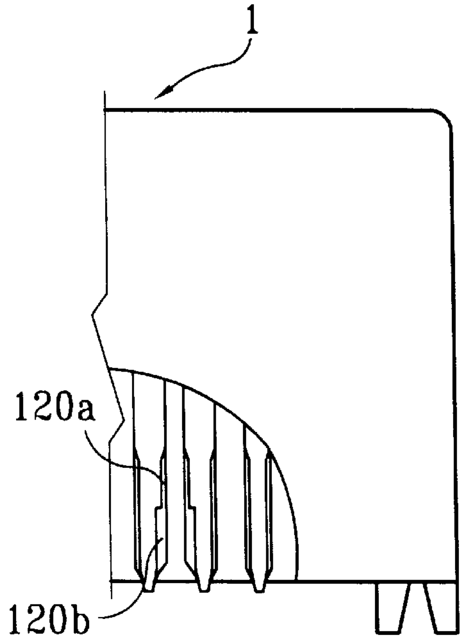
FIG. 9B is a schematic partial cutaway sectional view showing a folded plate type dielectric housing unit of the join-structure of a high-density connector and an interface module of this invention.
Figure 10:
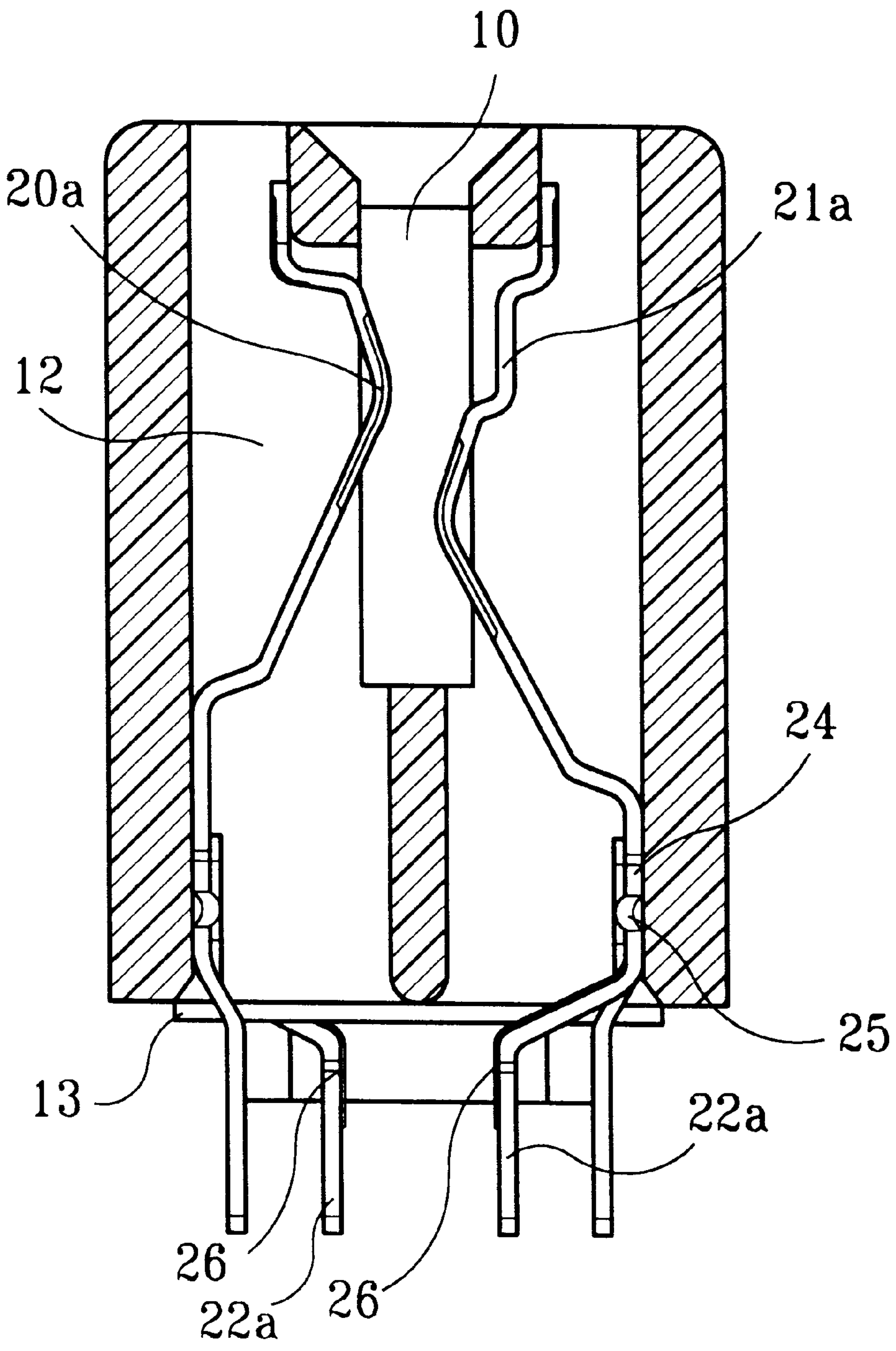
FIG. 10 is a schematic partial cutaway sectional view showing folded plate type terminals of the join-structure of a high-density connector and an interface module of this invention.
Figure 11:
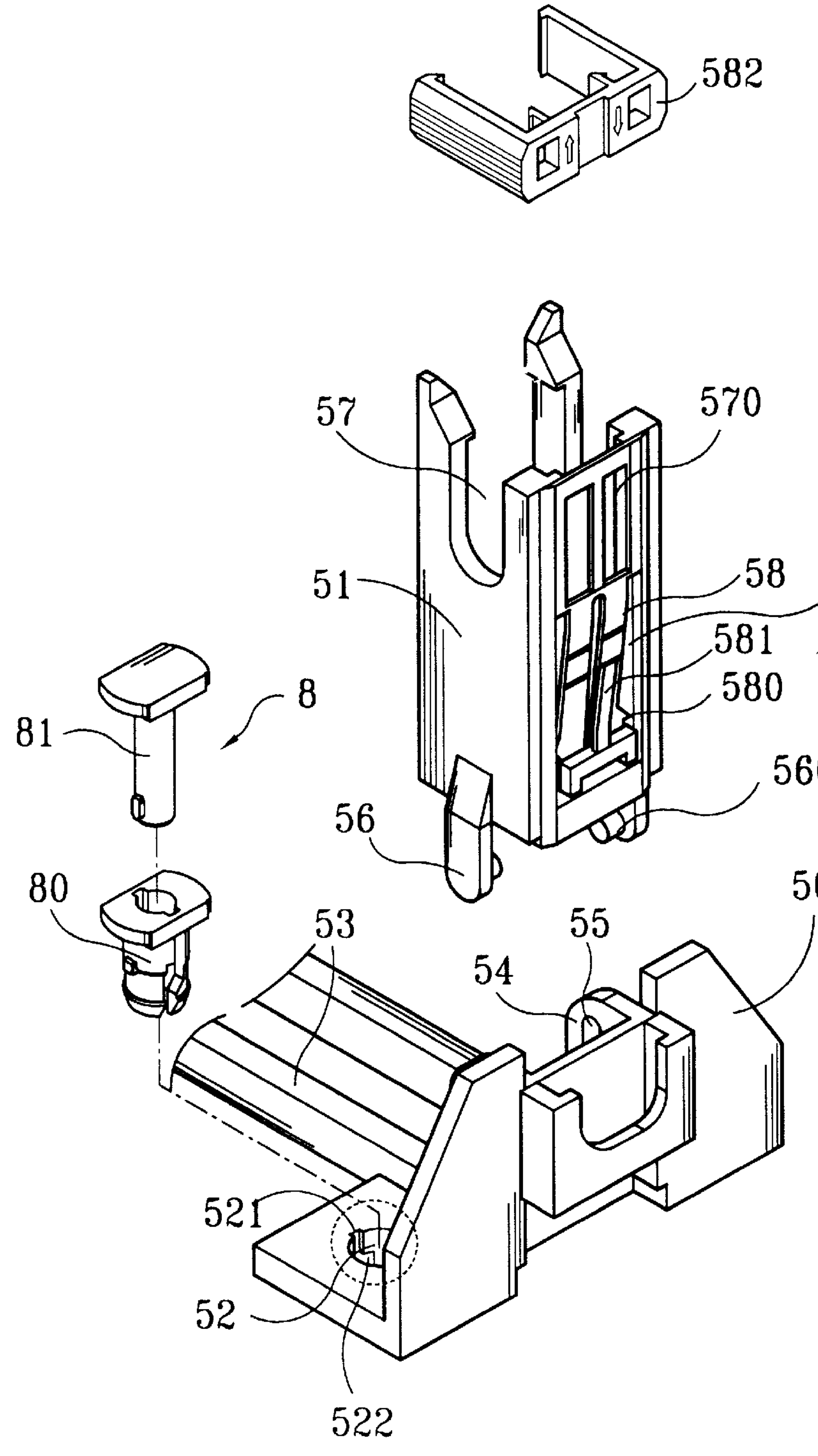
FIG. 11 is a schematic three-dimensional exploded view showing a retention mechanism of the join-structure of a high-density connector and an interface module of this invention.
Figure 11A:
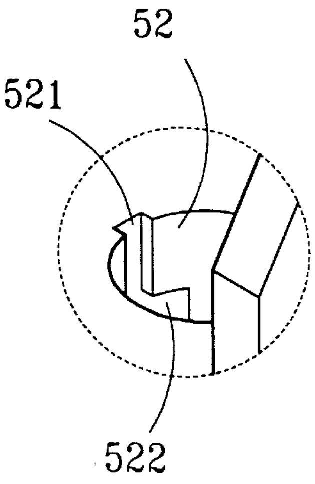
FIG. 11A is an amplified view of the circled portion in FIG. 11.

As shown in FIG. 9A, FIG. 9B, and FIG. 10, the fixing recess 120 corresponding to the two-layer terminals 2 is constructed in a two-section type, that is the first section 120*a* and the second section 120*b;* the former is to receive the first section fixing root 24, and the latter for the second fixing root 25. In virtue of the enhancing protruded strip 26 and thick inner walls, the lower layer terminals 21*a* can be buried in the fixing recess 120 in a firm construction. As shown in FIG. 1A, FIG. 1B, FIG. 11, and FIG. 11A, a retention mechanism 5 comprises a base 50 and a frame 51, wherein a pair of bases 50 are installed in opposite positions independently or linked with a bridge 53 on a motherboard. A through hole 52 is provided at corresponding positions in the base 50, wherein a guide flute 521 and a positioning recess 522 are disposed for receiving a fixing device 8, and a flange 84 near bottom thereof is used to fix the base 50 onto the motherboard 4. On lateral face 54 of the base 50, a positioning hole 55 is offered at each of two corresponding positions respectively. A recess 57 is formed at each of two lateral walls, and two windows are opened at upper portion of the back wall for fixing a fastening portion 62 in a cartridge type interface module 3. At bottom sides of the frame 51, a fixing pin 56 is provided, wherein a positioning pin 560 is offered to join the positioning hole 55 to enable the frame 51 to pivot within a limited angle. Moreover, a sliding groove is prepared on each of two corresponding inner walls of the frame 51, and in back wall thereof, an elastic leaf 58 locates right under the windows 570, a snap fastener 580 and a clamping tongue 581 are arranged below the elastic leaf 58, and the clamping tongue 581 can move in a limited range according to movement of a movable piece 582 that can slide up and down on the frame 51.

Figure 12A:
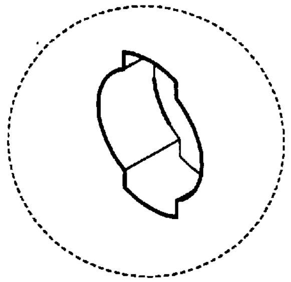
FIG. 12A is an amplified view of the circled portion in FIG. 12.
Figure 12:
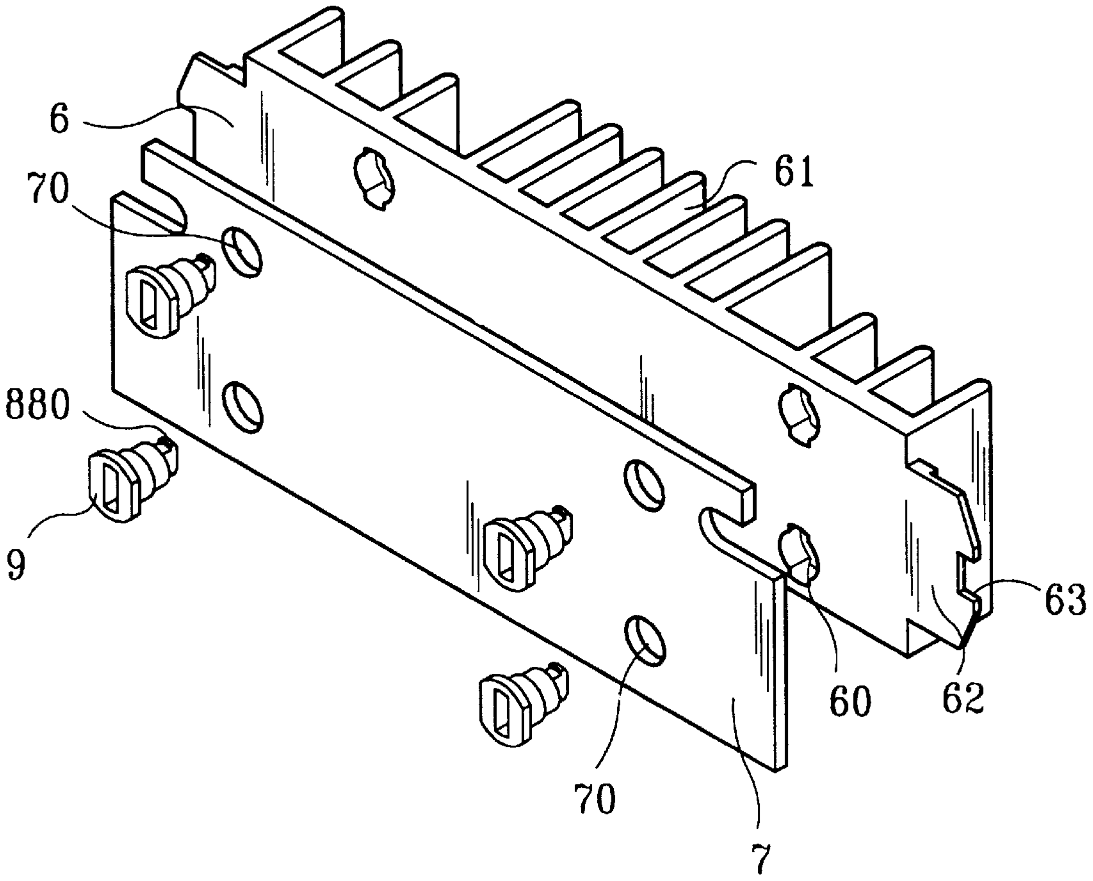
FIG. 12 shows another embodiment of the join-structure of a high-density connector and an interface module of this invention.
Figure 13C:
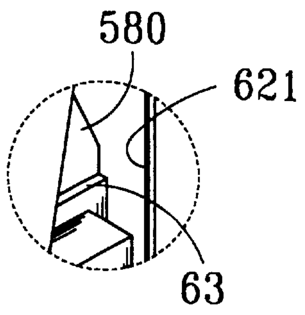
FIG. 13C is an amplified view showing the snap-fastening portion in FIG. 13A.
Figure 13A:
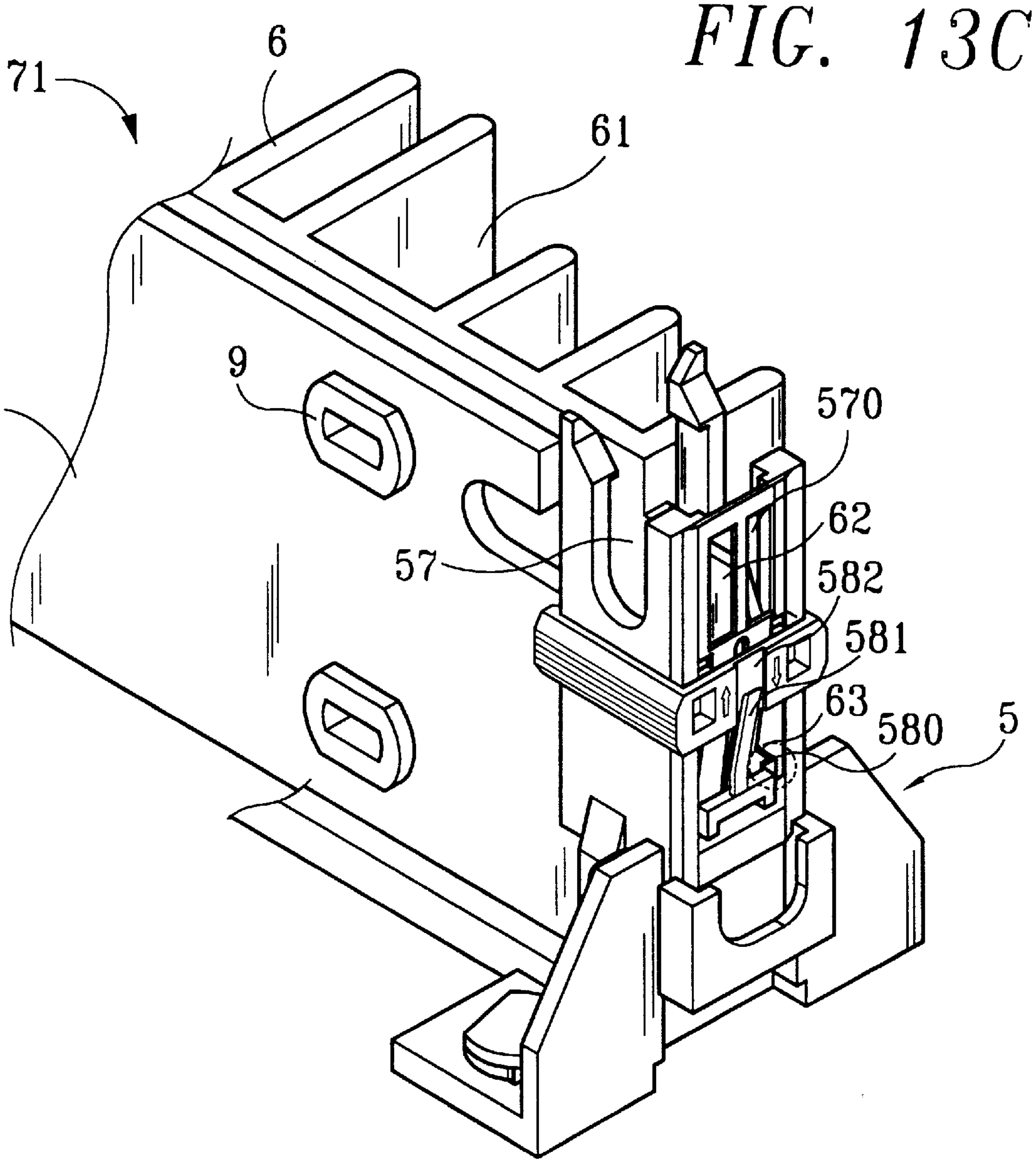
FIG. 13A is a schematic action view of the join-structure of a high-density connector and an interface module of this invention in FIG. 12.
Figure 13D:
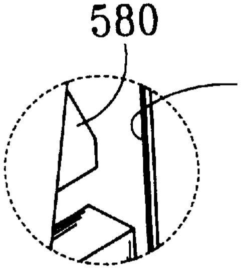
FIG. 13D is an amplified view showing the snap-fastening portion in FIG. 13B.
Figure 13B:
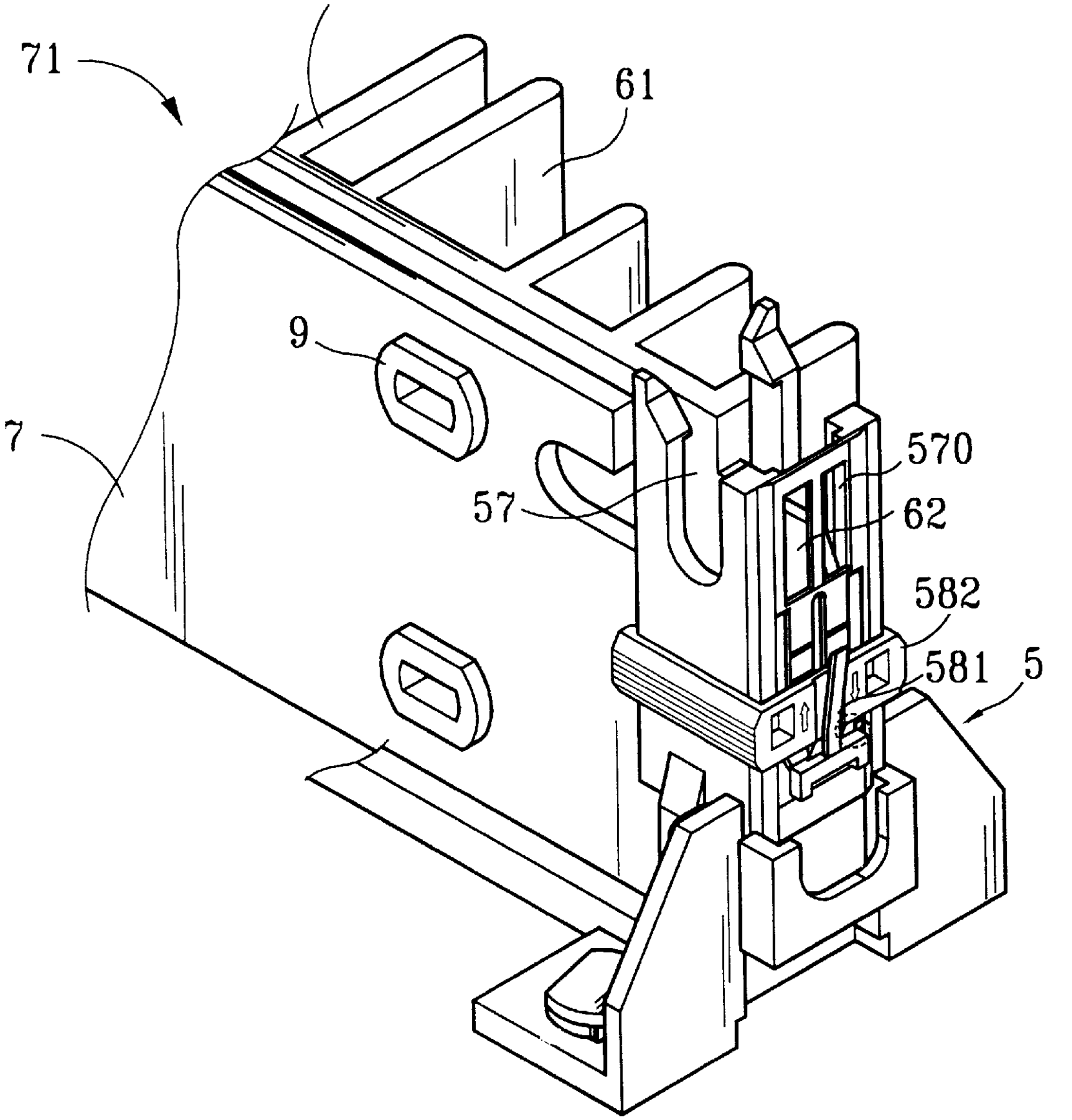
FIG. 13B is another schematic action view of the join-structure of a high-density connector and an interface module of this invention in FIG. 13A.

As shown in FIG. 12 and FIG. 12A, a circular hole 70 locates at each of four corners at an interface card 7, and attached thereto a heat sink 6 with fins 61 is provided with holes 60 at positions corresponding to that in card 1. At two lateral ends of the heat sink 6, a fastening portion 62 and a retaining recess 63 are formed respectively. A snap fastening portion 880 is arranged at rear end in a three-sectional fixing pin 9, which is to be inserted through the circular hole 70 and fastened on the heat sink 6. As shown in FIG. 13A, 13B, 13C, and 13D, when the movable piece 582 is pushed down wards to a preset point, the elastic leaf 58 is shoved outwards to lessen friction between two lateral ends of the fastening portion 62 and the elastic leaf 58 or the fastener 580. Then, push again the movable piece 582 upward to another preset point, the elastic leaf 58 will bounce back and let the fastener 580 be snap-fastened at the retaining recess 63 of the fastening portion 62; and reverse the above simple procedure to release the interface card 7.

Figure 14:
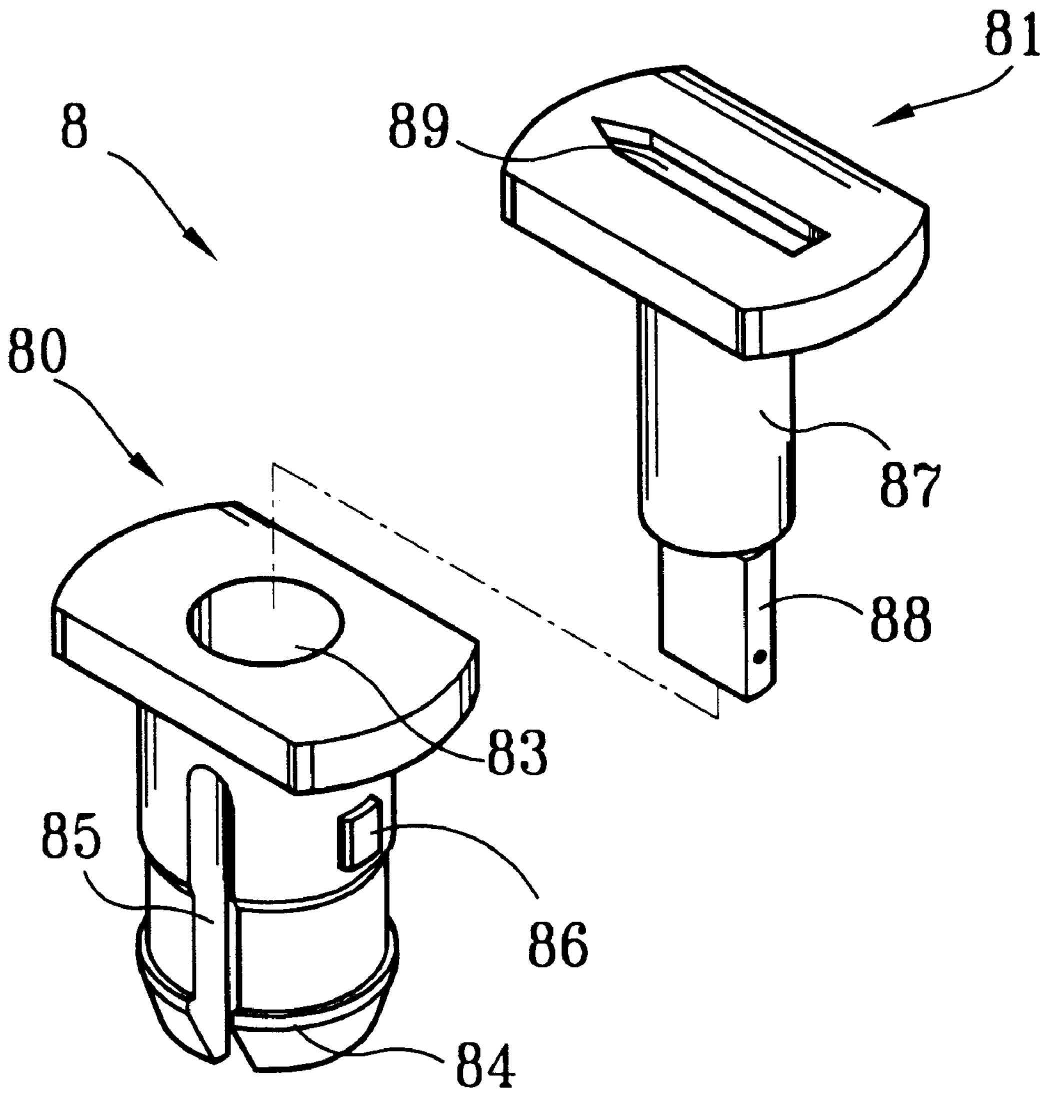
FIG. 14 is an embodiment diagram showing a pivot type fixing device of the join-structure of a high-density connector and an interface module of this invention.
Figure 15B:
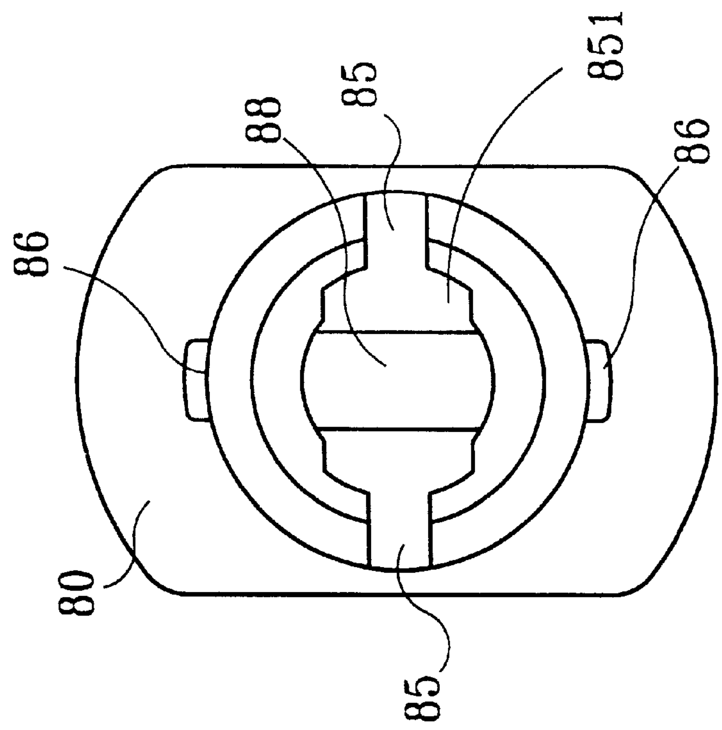
FIG. 15B is another schematic action view of the join-structure of a high-density connector and an interface module of this invention in FIG. 15A.
Figure 15A:
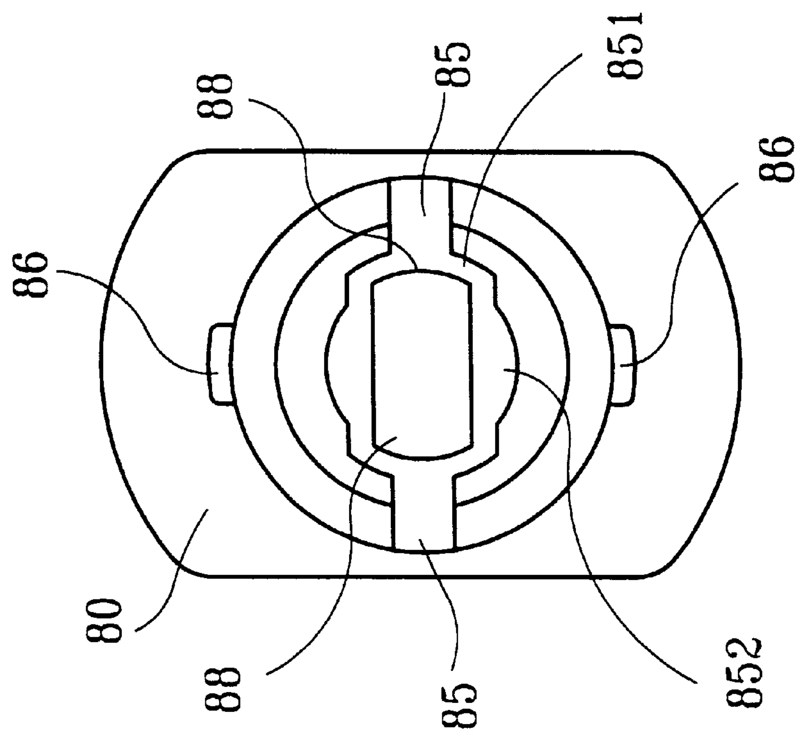
FIG. 15A is another schematic action view of the join-structure of a high-density connector and an interface module of this invention in FIG. 14.
Figure 16:
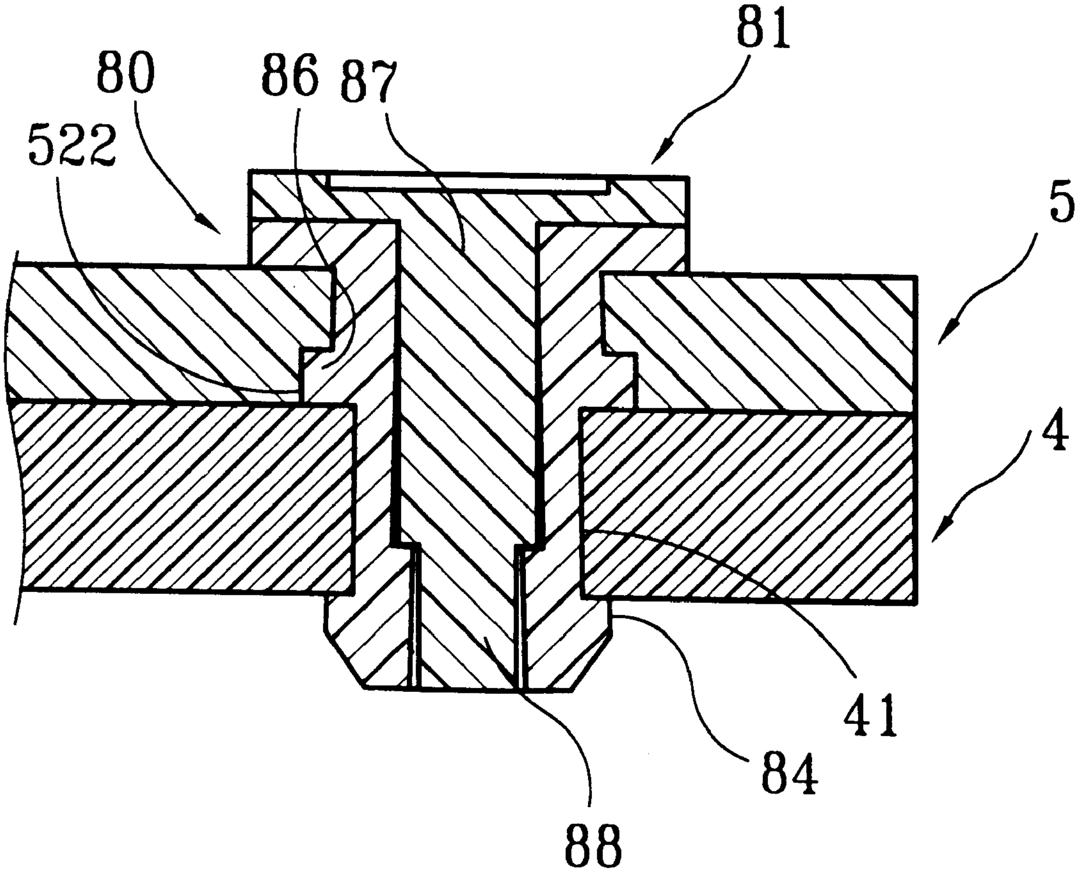
FIG. 16 is an embodiment diagram showing connection of the fixing device to a motherboard of the join-structure of a high-density connector and an interface module of this invention.

As shown in FIG. 14, and FIG. 15A, the fixing device 8 can be of a pivot type comprising a fixing device body 80, and a plug 81, wherein a plug-in hole 83 is formed in central portion of the fixing device body 80; a rim flange 84 is provided to its bottom portion; a dissection groove 85 is molded in each of two opposite lateral faces, and a protruding piece 86 is preserved on each of the rest two faces. The middle section of the plug 81 is a plug post 87, and its bottom end is a rectangular packing slat 88, and a slat 89 is formed at its top portion. When plugging the fixing device body 80 in the through hole 52 of the base 50, as shown in FIG. 16, the protruding piece 86 enters the guide flute 521 and turn to match the positioning recess 522 for a primary positioning purpose. Then, let the plug 81 enter the plugging hole 83, there the packing slat 88 will stay at a resting portion 851. The next step is to press the fixing device body 80 to penetrate a fixing hole 41 in the motherboard 4, and force the rim flange 84 to be snap-fastened at reverse face of the same board, now, a user may insert a driver or coin to the slot 89 and drive the plug 81 to turn 90°, so that the packing slat 88 will prop a bearing portion 852 to complete installation of the base 50 of the retention mechanism 5. On the contrary, when dismounting the fixing device is desired, all a user has to do is drive the plug 81 to turn another 90° to release the packing slat 88 from the bearing portion 852 to restore elasticity of the rim flange 84 for an easy detachment.

Figure 17:
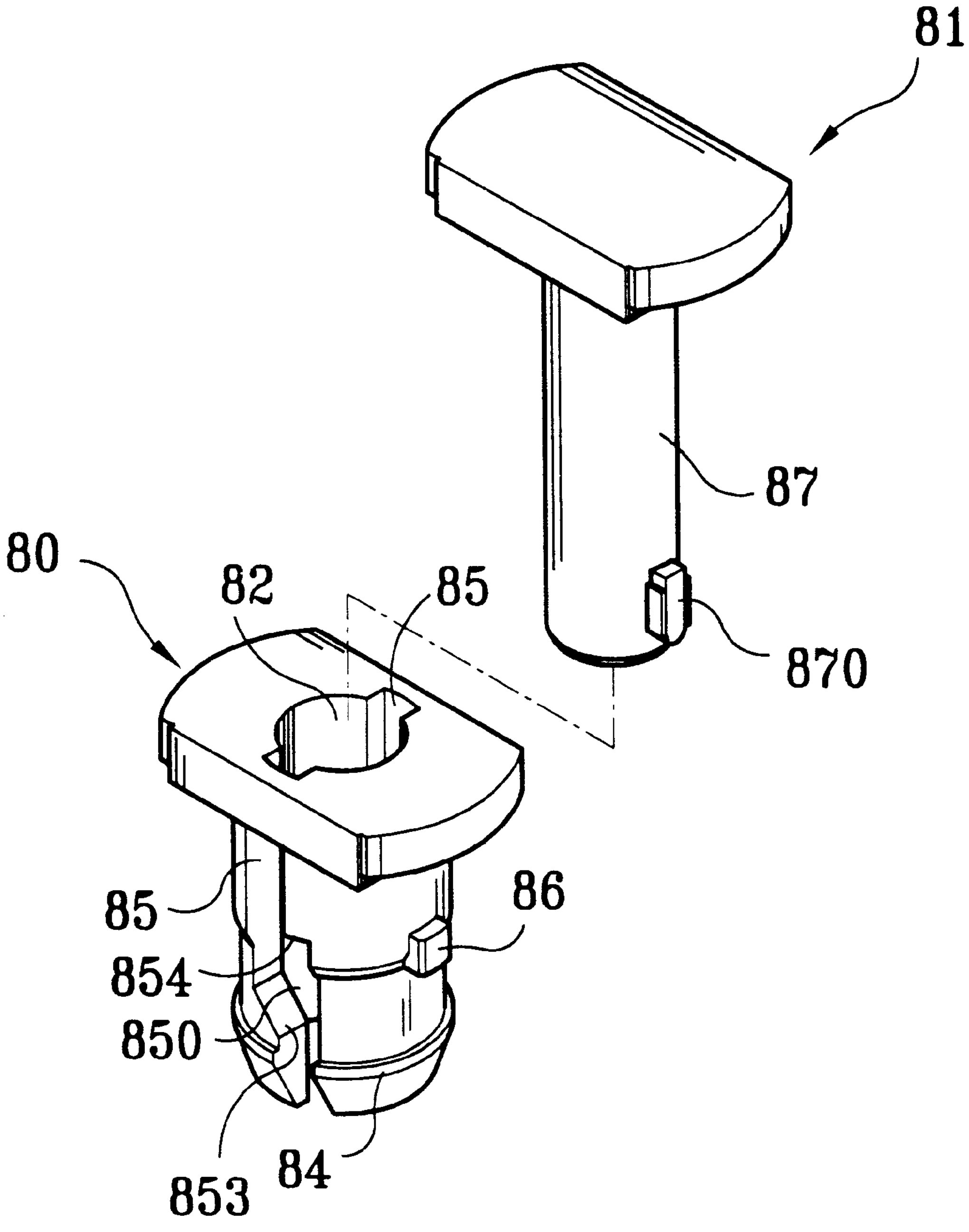
FIG. 17 is another embodiment diagram showing a plugged-to-fix device of the join-structure of a high-density connector and an interface module of this invention.
Figure 18B:
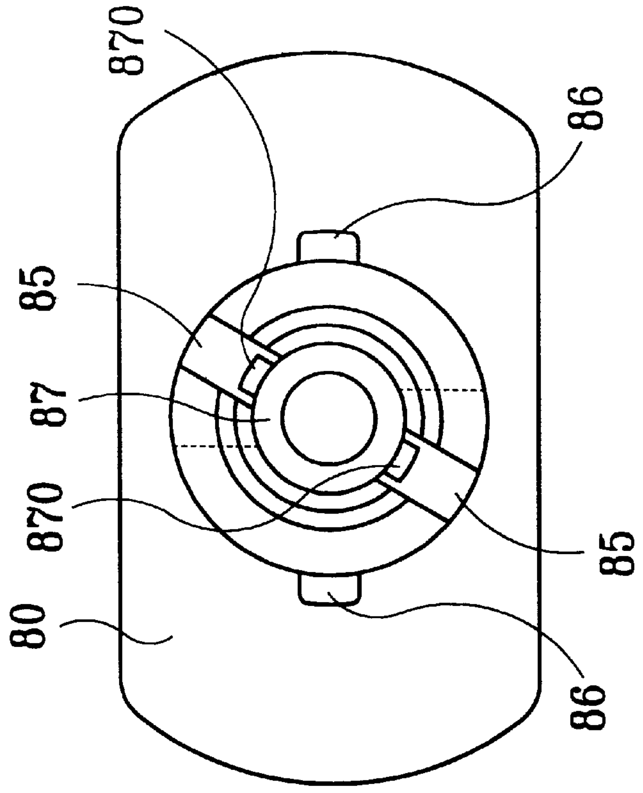
FIG. 18B is another schematic action view of the join-structure of a high-density connector and an interface module of this invention in FIG. 17A.
Figure 18A:
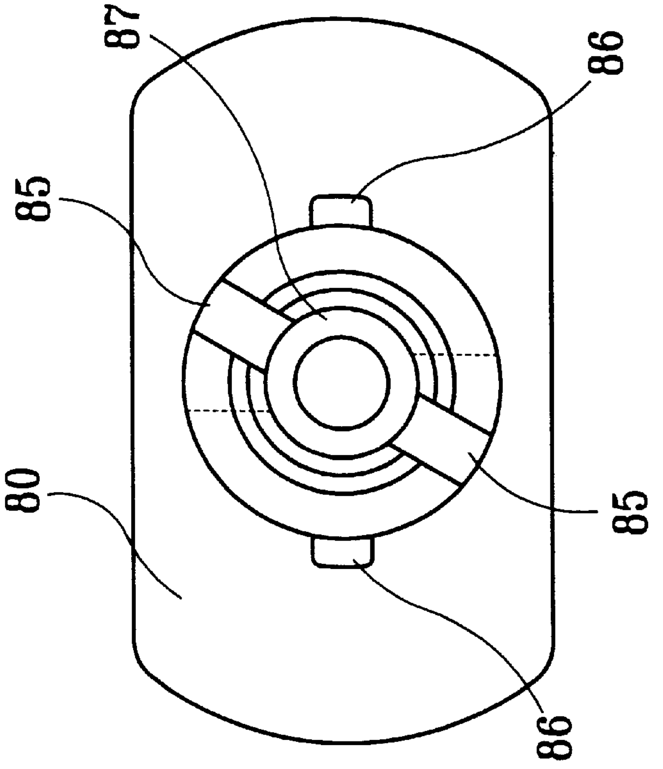
FIG. 18A is another schematic action view of the join-structure of a high-density connector and an interface module of this invention in FIG. 16.

As shown in FIG. 17, FIG. 18A, and FIG. 18B, the fixing device 8 can be of a plug-in type comprising a fixing device body 80 and a plug 81, wherein a plug-in hole 82 is formed in central portion of the fixing device body 80; a rim flange 84 is provided to bottom portion; a dissection groove 85 is molded in each of two opposite lateral faces, a guide slope 853 is offered thereunder, and a positioning portion 854 is arranged at middle section, which is extended to form a positioning groove 850; and the protruding piece 86 is preserved on each of the rest two lateral faces. A plug post 87 is provided to the plug 81, and a positioning protrusion 870 is formed at opposite positions on the plug post 87 near its bottom. When plugging the fixing device body 80 in the through hole 52 of the base 50, the protruding piece 86 enters the guide flute 521 and turns to match the positioning recess 522 for a primary positioning purpose. Owing to design of the dissection groove 85, the fixing device body 80 possesses elasticity to some extent. Plug the rim flange 84 in the fixing hole 41 of the motherboard 4, there the plug 81 seems to be loose-jointed because of elasticity. When a user is to insert the plug 81 in the fixing device 80, the positioning protrusion 870 must aim at the dissection groove 85, so that it will be guided by the guide slope 853 to turn an angle automatically and rest at bottom of the positioning groove 850, and when more pressure is exerted, the rim flange 84 will be tightly snap-fastened and becoming stiff in the fixing hole 41 of the motherboard 4. For dismounting, just pull the plug 81 upwards, and the positioning protrusion 870 will be stopped at the positioning portion 854, the entire plug 81 will not be pulled out thoroughly, so that it will fly nowhere without troubling to find and put it back to the plug-in hole 82 accordingly.

In short, when comparing with the above-cited prior skills, the join-structure of high-density connector and interface module is advantageous in:

1. The lateral contact type terminals that can save material, area, and volume;
2. The cross alignment of plate contact type terminals that can save material;
3. The Join-structure of fixing device and plug of plug-in or pivot type that facilitates an easy mounting or dismounting of the retention mechanism;
4. The three-sectional fixing pin used to combine an interface card and a heat sink that can attain an efficacy of low cost and easy mounting/dismounting;
5. A Fastener and its clamping tongue of the elastic leaf in the retention mechanism that can fasten either a card type or a cartridge type interface module;
6. The movable piece of the retention mechanism that provides an easy operation of mounting/dismounting an interface module.

In the above described, at least one preferred embodiment has been elucidated with reference to relating drawings annexed, it is apparent that numerous variations or modifications may be made without departing from the true spirit and scope thereof, as set forth in the following claims.

What is claimed is:

1. A joining structure for a high-density connector and interface module comprising:

a dielectric housing unit comprising a plurality of partitioned reception grooves aligned in two rows, a fixing recess, and a long protrusion strip on a bottom side of said dielectric housing unit;

a plurality of terminals received in said reception grooves and electrically isolated from each other;

an interface card and a heat sink joined together by connecting means;

a motherboard; and a pair of retention mechanisms that receive said interface card and said heat sink, said retention mechanisms are affixed to said motherboard by means of at least one fixing means; wherein said terminals are grouped in pairs, and said terminals each include a protruding fixing strip projecting from a fixing root thereof, and said protruding fixing strip comprises a protruded burr face that facilitates attachment of said fixing root to said fixing recess, and said fixing strip further includes on a front face thereof a protruded dot that facilitates affixation of said terminals at a central portion of said reception grooves.

2. A joining structure for a high-density connector and interface module comprising:

a dielectric housing unit comprising a plurality of partitioned reception grooves aligned in two rows, a fixing recess, and a long protrusion strip on a bottom side of said dielectric housing unit;

a plurality of terminals received in said reception grooves and electrically isolated from each other;

an interface card and a heat sink joined together by connecting means;

a motherboard; and a pair of retention mechanisms that receive said interface card and said heat sink, said retention mechanisms are affixed to said motherboard by means of at least one fixing means; wherein said fixing means is a pivoting fixing device comprising a device body and a plug;

said device body comprises a plug-in hole, a rim flange formed around a bottom portion, at least one expansion groove formed in a lateral face of said device body, and at least one protruding piece on a lateral face of said device body; and said plug comprises a plug post with a packing slat at a lower end of said plug post; such that said device body is inserted into a through hole on said fixing device and a fixing hole in said motherboard, said at least one protruding piece of said device body being received in a slot in said fixing device, said rim flange being aligned with a lower surface of said motherboard, said plug post being rotated in said plug-in hole so that said packing slat expands said device body, the expansion of said device body being facilitated by said expansion groove, said rim flange being spread outside said fixing hole so that said fixing device is securely fastened to said motherboard.

3. A joining structure for a high-density connector and interface module comprising:

a dielectric housing unit comprising a plurality of partitioned reception grooves aligned in two rows, a fixing recess, and a long protrusion strip on a bottom side of said dielectric housing unit;

a plurality of terminals received in said reception grooves and electrically isolated from each other;

an interface card and a heat sink joined together by connecting means;

a motherboard; and a pair of retention mechanisms that receive said interface card and said heat sink, said retention mechanisms are affixed to said motherboard by means of at least one fixing means; wherein said fixing means is a plug-in fixing device comprising a device body and a plug;

said device body comprises a plug-in hole, a rim flange at a bottom portion, at least one expansion groove formed in a lateral face of said device body, a positioning portion at a middle section, a guide slope at a lower section and a positioning groove thereunder, and at least one protruding piece on a lateral face of said device body; and said plug comprises a plug post with a protruding piece at a lower end thereof; such that said device body is inserted into a through hole on said fixing device and a fixing hole in said motherboard, said at least one protruding piece of said device body being received in a slot in said fixing device, said rim flange being aligned with a lower surface of said motherboard, said plug post being rotated in said plug-in hole so that said protruding piece of said plug post expands said device body, the expansion of said device body being facilitated by said expansion groove, said rim flange being spread outside said fixing hole so that said fixing device is securely fastened to said motherboard.

4. A joining structure for a high-density connector and interface module comprising:

a dielectric housing unit comprising a plurality of partitioned reception grooves aligned in two rows, a fixing recess, and a long protrusion strip on a bottom side of said dielectric housing unit;

a plurality of terminals received in said reception grooves and electrically isolated from each other;

an interface card and a heat sink joined together by connecting means;

a motherboard; and a pair of retention mechanisms that receive said interface card and said heat sink, said retention mechanisms are affixed to said motherboard by means of at least one fixing means; and wherein a fastening portion is positioned at a rear end of said protruding piece, said fastening portion being retained in sliding grooves of said frame to form a dual-track construction, and wherein an arc guide is disposed at a bottom of said protruding piece which is extended to form a shoving portion.

* * * * *